United States Patent
Park et al.

(10) Patent No.: US 9,287,363 B2
(45) Date of Patent: Mar. 15, 2016

(54) SEMICONDUCTOR DEVICE, METHOD OF MANUFACTURING THE SAME AND POWER SEMICONDUCTOR DEVICE INCLUDING THE SAME

(71) Applicant: SAMSUNG ELECTRO-MECHANICS CO., LTD., Suwon-Si, Gyeonggi-Do (KR)

(72) Inventors: Jae Hoon Park, Suwon-Si (KR); In Hyuk Song, Suwon-Si (KR); Chang Su Jang, Suwon-Si (KR); Kee Ju Um, Suwon-Si (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/273,269

(22) Filed: May 8, 2014

(65) Prior Publication Data
US 2015/0187882 A1 Jul. 2, 2015

(30) Foreign Application Priority Data
Dec. 27, 2013 (KR) .................. 10-2013-0165332

(51) Int. Cl.
*H01L 29/16* (2006.01)
*H01L 21/04* (2006.01)
*H01L 29/78* (2006.01)
*H01L 29/51* (2006.01)
*H01L 29/49* (2006.01)

(52) U.S. Cl.
CPC .......... *H01L 29/1608* (2013.01); *H01L 21/049* (2013.01); *H01L 29/4916* (2013.01); *H01L 29/518* (2013.01); *H01L 29/78* (2013.01)

(58) Field of Classification Search
None
See application file for complete search history.

(56) References Cited

U.S. PATENT DOCUMENTS

2009/0186455 A1* 7/2009 Bedell et al. .................. 438/199
2013/0130460 A1* 5/2013 Liao et al. .................... 438/299

FOREIGN PATENT DOCUMENTS

JP    2006-216918 A    8/2006
JP    2010-067917 A    3/2010

* cited by examiner

*Primary Examiner* — Evan Pert
*Assistant Examiner* — Leslie Pilar Cruz
(74) *Attorney, Agent, or Firm* — McDermott Will & Emery LLP

(57) ABSTRACT

A method of manufacturing a semiconductor device may include: preparing a substrate formed of SiC; depositing crystalline or amorphous silicon (Si) on one surface of the substrate to form a first semiconductor layer; and performing a heat treatment under a nitrogen atmosphere to form a second semiconductor layer formed of SiCN between the substrate and the first semiconductor layer.

12 Claims, 3 Drawing Sheets

SEMICONDUCTOR DEVICE, METHOD OF MANUFACTURING THE SAME AND POWER SEMICONDUCTOR DEVICE INCLUDING THE SAME

CROSS-REFERENCE TO RELATED APPLICATION

This application claims the benefit of Korean Patent Application No. 10-2013-0165332 filed on Dec. 27, 2013, with the Korean Intellectual Property Office, the disclosure of which is incorporated herein by reference.

BACKGROUND

The present disclosure relates to a semiconductor device having an excellent interface state, a method of manufacturing the same, and a power semiconductor device including the same.

Recently, semiconductor devices are increasingly required to have high levels of performance such as fast operational speeds or low current loss.

To meet such requirements, semiconductor devices have recently tended to be formed using silicon carbide (SiC), instead of silicon (Si).

Silicon carbide (SiC) is a semiconductor material having great potential in applications related to high power, high frequency, and high temperature devices.

Silicon carbide (SiC) has a bandgap approximately three times wider and a dielectric breakdown field approximately ten times greater than silicon (Si), exhibiting excellent durability with respect to heat resistance or high voltage levels and having a significantly rapid electron drift speed.

In particular, since a dielectric breakdown field of silicon carbide (SiC) is 10 times higher than that of silicon (Si), even in the case that a depletion layer is formed to be relatively thin in a p-n junction or Schottky junction portion, a high level of breakdown voltage may be maintained.

Thus, the use of silicon carbide (SiC) may decrease a thickness of devices and increase doping concentration, such that a power semiconductor device having low ON resistance and high withstand voltage and making low loss is anticipated as being able to be realized with the use thereof.

However, it has been discovered that a metal-oxide semiconductor field effect transistor (MOSFET) semiconductor device manufactured using silicon carbide (SiC) has low carrier mobility in a channel region, as compared to a semiconductor manufactured with silicon (Si).

This is due to the fact that, in the case of forming an oxide such as silicon oxide ($SiO_2$) on one surface of a semiconductor layer formed of silicon carbide (SiC), dangling bond or carbon (C) is extracted from an interface between the carbide silicon (SiC) and the silicon oxide ($SiO_2$) to increase interface state density thereof.

Such an increase in interface state density leads to a reduction in carrier mobility of a semiconductor device using carbide silicon (SiC), mainly reducing performance of the semiconductor device.

Thus, in manufacturing a semiconductor device such as an MOSFET using silicon carbide (SiC), a method of lowering interface state density is required.

SUMMARY

An aspect of the present disclosure may provide a semiconductor device having lowered interface state density, and a method of manufacturing the same.

According to an aspect of the present disclosure, a method of manufacturing a semiconductor device may include: preparing a substrate formed of SiC; depositing crystalline or amorphous silicon (Si) on one surface of the substrate to form a first semiconductor layer; and performing a heat treatment under a nitrogen atmosphere to form a second semiconductor layer formed of SiCN between the substrate and the first semiconductor layer.

The method may further include forming a third semiconductor layer on the first semiconductor layer using a Si compound.

The method may further include performing a heat treatment under a nitrogen atmosphere to form a fourth semiconductor layer between the third semiconductor layer and the first semiconductor layer, after the forming of the third semiconductor layer.

The third semiconductor layer may be formed by oxidizing, nitriding, or oxy-nitriding an upper portion of the first semiconductor layer.

The forming of the second semiconductor layer may be undertaken at a temperature lower than an oxidation temperature of the first semiconductor layer.

According to another aspect of the present disclosure, a semiconductor device may include: a substrate formed of SiC; a first semiconductor layer disposed on the substrate and formed of silicon (Si); and a second semiconductor layer disposed between the first semiconductor layer and the substrate and formed of SiCN.

The semiconductor device may further include a third semiconductor layer disposed on the first semiconductor layer and formed of a Si compound.

The semiconductor device may further include a fourth semiconductor layer disposed between the third semiconductor layer and the first semiconductor layer and formed of SiON.

The Si compound may be at least one selected from the group consisting of $SiO_2$, $Si_xN_{1-x}$ (0<x<1), and SiON.

The first semiconductor layer may include amorphous or crystalline Si.

According to another aspect of the present disclosure, a power semiconductor device may include: a first conductivity-type substrate formed of SiC; a first conductivity-type drift region disposed on the substrate and formed of SiC; a second conductivity-type body region disposed on the drift region and formed of SiC; a first conductivity-type source region disposed in an upper portion of the body region; a first conductivity-type drain region disposed in an upper portion of the body region; a first gate layer disposed on an upper surface of the body region, covering portions of the source region and the drain region, and formed of SiCN; a second gate layer disposed on the first gate layer and formed of amorphous silicon; a third gate layer disposed on the second gate layer and formed of SiCN; a fourth gate layer disposed on the third gate layer and formed of a silicon compound; and a gate electrode disposed on the fourth gate layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
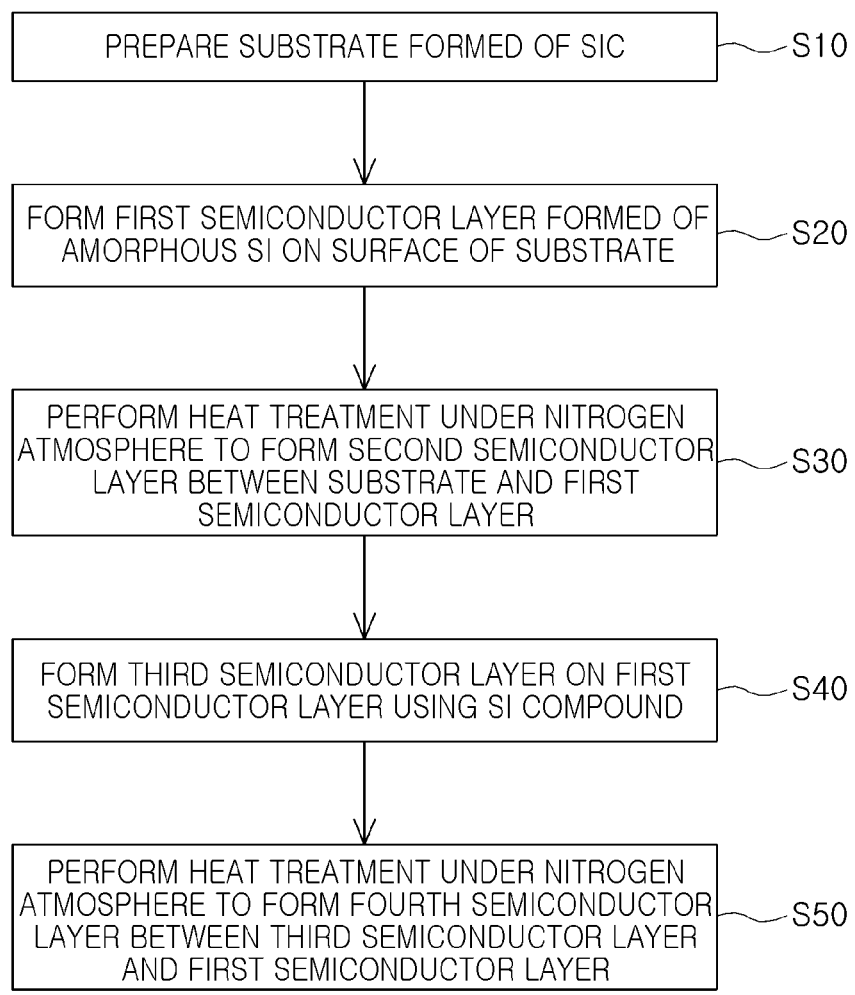
FIG. 1 is a flowchart illustrating a method of manufacturing a semiconductor device according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Throughout the specification, the terms "n-type" and "p-type" may be defined as a first conductivity type or a second conductivity type, and here, the first conductivity type and the second conductivity type are different types of conductivity.

For clarification, the first conductivity type will be used as an n-type and the second conductivity type will be used as a p-type, but the present disclosure is not limited thereto.

FIG. 1 is a flowchart illustrating a method of manufacturing a semiconductor device according to an exemplary embodiment of the present disclosure, and FIGS. 2 through 6 are cross-sectional views illustrating sequential processes in a method of manufacturing a semiconductor device according to an exemplary embodiment of the present disclosure.

Hereinafter, a method of manufacturing a semiconductor device and a structure thereof will be descried with reference to FIGS. 1 and 2 through 6.

Figure 2:
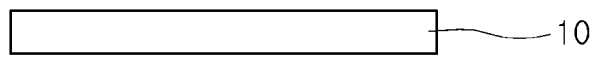
FIGS. 2 through 6 are cross-sectional views illustrating sequential processes in a method of manufacturing a semiconductor device according to an exemplary embodiment of the present disclosure.

Referring to FIG. 2, a substrate 10 formed of SiC may be prepared (S10).

The substrate 10 may be formed to have an appropriate thickness by depositing SiC through an epitaxial method, but the present disclosure is not limited thereto.

For example, the substrate 10 may be formed using a silane gas ($SiH_4$) and a propane gas ($C_3H_8$) as material gases, and a hydrogen gas ($H_2$).

Operation S10 of preparing the substrate 10 formed of SiC may be performed using n-type SiC or p-type SiC as needed.

Figure 3:

Referring to FIG. 3, after operation S10 of preparing the substrate 10 formed of SiC, a first semiconductor layer 20 formed of crystalline or amorphous silicon may be formed on the substrate 10 (S20).

A method of forming the crystalline or amorphous silicon may be performed by using chemical vapor deposition (CVD), but the present disclosure is not limited thereto.

For example, the first semiconductor layer 20 may be formed using a silane gas ($SiH_4$) as a material gas through CVD.

Alternatively, the first semiconductor layer 20 may be formed by depositing amorphous silicon (Si) through sputtering.

Operation S20 of forming the first semiconductor layer 20 may be performed at a temperature of 680° C. or lower.

Thus, during operation S20 of forming the first semiconductor layer 20, oxidation of the substrate 10 may be prevented.

Namely, by preventing oxidation of the substrate 10, an interface state density between the substrate 10 and the first semiconductor layer 20 may later be lowered.

The first semiconductor layer 20 may be formed to have a thickness ranging from a few Å to a few μl.

If the first semiconductor layer 20 is too thick, it may be difficult to forma second semiconductor layer 30 formed of SiCN between the substrate and the first semiconductor layer 20 later.

Even after the process of forming the second semiconductor layer 30, a third semiconductor layer 40, and a fourth semiconductor layer 50, a portion of the first semiconductor layer 10 may still include amorphous silicon or crystalline silicon.

In the case in which the first semiconductor layer 20 includes amorphous silicon or crystalline silicon, a considerable reduction in an amount of gate leakage current may occur when a MOS structure is formed using the amorphous or crystalline silicon of the first semiconductor layer 10.

Figure 4:
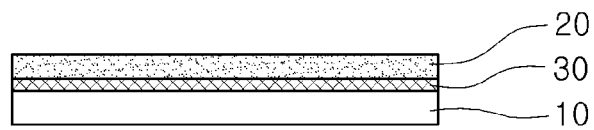

Referring to FIG. 4, after operation S20 of forming the first semiconductor layer 20, the second semiconductor layer 30 may be formed between the substrate 10 and the first semiconductor layer 20 through a heat treatment under a nitrogen atmosphere (S30).

In operation S30 of forming the second semiconductor layer 30, an interface state density between the substrate 10 and the first semiconductor layer 20 may be lowered using a gas including nitrogen.

Operation S30 of forming the second semiconductor layer 30 may be performed through plasma-enhanced CVD (PE-CVD).

Here, the interface state density between the substrate 10 and the first semiconductor layer 20 may be lowered by performing a heat treatment under a nitrogen atmosphere through a general method, but it is not sufficient.

However, in the method of manufacturing a semiconductor device according to the present exemplary embodiment, nitrogen may be diffused or permeate between the substrate 10 and the first semiconductor layer 20 through the PE-CVD, so that the interface state density between the substrate 10 and the first semiconductor layer 20 may be lowered.

For example, nitrogen is changed into a plasma state as particles having a high energy level within a PE-CVD chamber, and the nitrogen particles having a high energy level may be diffused or permeate through the first semiconductor layer 20 formed of amorphous silicon, even into an interface between the substrate 10 and the first semiconductor layer 20.

The nitrogen particles diffused or permeating into the interface between the substrate 10 and the first semiconductor layer 20 are combined with atoms such as silicon (Si), carbon (C), oxygen (O), and the like, present in the interface to form SiCN, reducing dangling bonds present in the interface and preventing extraction of carbon (C), and thus, the interface state density between the substrate 10 and the first semiconductor layer 20 may be lowered.

In the method of manufacturing a semiconductor device according to the present exemplary embodiment, since the second semiconductor layer 30 is formed through PE-CVD after the first semiconductor layer 20 is formed of amorphous silicon, a possibility of oxidizing the substrate 10 formed of SiC is reduced, and thus, an interface state density may be lowered.

Figure 5:
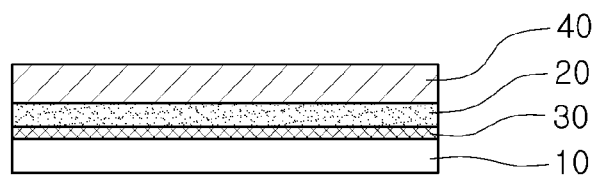

Referring to FIG. 5, after operation S30 of forming the second semiconductor layer 30, the third semiconductor layer 40 may be formed on the first semiconductor layer 20 by using a silicon compound.

The silicon compound may be at least one selected from the group consisting of $SiO_2$, $Si_xN_{1-x}$ (0<x<1), and SiON.

Namely, the third semiconductor layer 40 may serve as an insulating layer (oxide layer) in the metal oxide semiconductor (MOS).

The silicon compound may be formed by using a method such as CVD, or the like, but the present disclosure is not limited thereto.

For example, operation S30 of forming the third semiconductor layer 40 may be performed by including operation of oxidizing or oxy-nitriding an upper portion of the first semiconductor layer 20.

Figure 6:
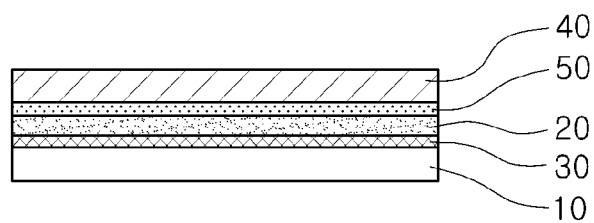

Finally, referring to FIG. 6, the fourth semiconductor layer 50 may be formed between the third semiconductor layer 40 and the first semiconductor layer 20 through a heat treatment under a nitrogen atmosphere (S50).

Operation S50 of forming the fourth semiconductor layer may be performed through PE-CVD.

For example, nitrogen is changed into a plasma state as particles having a high energy level within a PE-CVD chamber, and the nitrogen particles having a high energy level may be diffused or permeate through the third semiconductor layer 40, even into an interface between the first semiconductor layer 20 and the third semiconductor layer 40.

Thus, an interface state density of the interface between the third semiconductor layer 40 and the first semiconductor layer 20 may be lowered.

In the case of forming a metal layer on an upper surface of the semiconductor device manufactured as described above, an MOS structure having an excellent interface state may be formed.

Thus, the method of manufacturing a semiconductor device according to the present exemplary embodiment and a power semiconductor device using the semiconductor device manufactured by the method may have low interface state density, as well as having excellent characteristics of carbide silicon (SiC).

Figure 7:
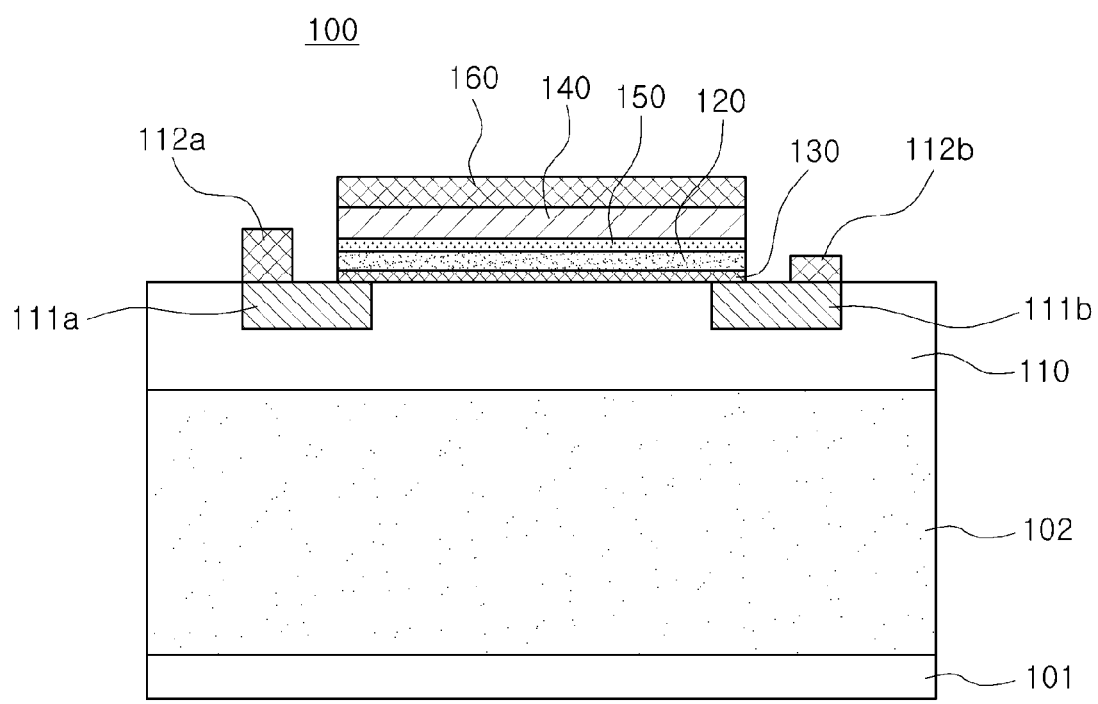
FIG. 7 is a cross-sectional view illustrating a structure of a power semiconductor device according to an exemplary embodiment of the present disclosure.

FIG. 7 is a cross-sectional view illustrating a structure of a power semiconductor device according to an exemplary embodiment of the present disclosure.

FIG. 7 illustrates an MOSFET according to this exemplary embodiment of the present disclosure including the aforementioned semiconductor device as an MOS structure.

Referring to FIG. 7, a power semiconductor device according to this exemplary embodiment of the present disclosure may include: a first conductivity-type substrate 101 formed of SiC; a first conductivity-type drift region 102 disposed on the substrate 101 and formed of SiC; a second conductivity-type body region 110 disposed on the drift region 102 and formed of SiC; a first conductivity-type source region 111a disposed in an upper portion of the body region 110; a first conductivity-type drain region 111b disposed in an upper portion of the body region 110; a first gate layer 130 disposed on an upper surface of the body region 110, covering portions of the source region 111a and the drain region 111b, and formed of SiCN; a second gate layer 120 disposed on the first gate layer 130 and formed of amorphous silicon; a third gate layer 150 disposed on the second gate layer 120 and formed of SiCN; a fourth gate layer 140 disposed on the third gate layer 150 and formed of a silicon compound, and a gate electrode 160 disposed on the fourth gate layer 140.

A source metal layer 112a may be formed on the source region 111a, and a drain metal layer 112b may be formed on the drain region 111b.

The substrate 101 may be formed of n-type SiC.

The drift region 102 may be formed by growing n-type SiC on the substrate 101 through an epitaxial method.

The body region 110 may be formed by growing p-type Sic on the drift region 102 through an epitaxial method, or may be formed by injecting p-type impurities into an upper portion of the drift region 102.

The source region 111a and the drain region 111b may be formed by covering portions of the upper surface of the body region 110 with a mask and subsequently injecting n-type impurities into portions of the body region 110 which are not covered by the mask.

Thereafter, a gate may be formed on the body region 110 while covering portions of the source region 111a and the drain region 111b.

The gate may be formed by using the method of manufacturing a semiconductor device according to the previous exemplary embodiment of the present disclosure.

Namely, the MOS structure of the power semiconductor device according to this exemplary embodiment of the present disclosure may be formed of the structure manufactured by the method of manufacturing a semiconductor device according to the previous exemplary embodiment of the present disclosure, and thus, it has low interface state density in an interface in which the body region 110 and the gate are in contact.

In the power semiconductor device according to this exemplary embodiment of the present disclosure, when voltage is applied to the gate electrode 160, a channel may be formed below the first gate layer 130.

Namely, when a positive (+) voltage is applied to the gate electrode 160, a channel is formed in the body region 110 below the first gate layer 130, and current may flow through the channel.

In the related art power semiconductor device using SiC, since an interface state density of an interface between SiC and $SiO_2$ is so high that carrier mobility is reduced to deteriorate performance of the power semiconductor device.

In contrast, in the case of the power semiconductor device according to this exemplary embedment of the present disclosure, the SiCN semiconductor layer is formed on the SiC semiconductor region to thereby lower the interface state density of the semiconductor layer using SiC and the semiconductor layer using amorphous silicon, and in addition, by forming the SiCN semiconductor layer and the silicon compound on the amorphous silicon, an increase in the interface state density may be prevented.

Thus, in the power semiconductor device according to this exemplary embedment of the present disclosure, since carrier mobility in the channel is not reduced, resulting in low ON resistance.

Thus, current loss in the power semiconductor device may be reduced to enhance performance of the power semiconductor device.

Namely, since the interface state density of the interface between the body region 110 in which the channel is formed and the gate is low, current loss in the power semiconductor device may be lowered when operated, and since SiC is used, the power semiconductor device may have excellent properties such as high power, high frequency, and high temperature application.

The aforementioned exemplary embodiment may not only be applied to the MOSFET and may also be applied to insulated gate bipolar transistor (IGBT) or various types of thyristor.

As set forth above, in a method of manufacturing a semiconductor device according to exemplary embodiments of the present disclosure, since amorphous silicon is deposited on a substrate formed of SiC to forma first semiconductor layer and a heat treatment is performed under a nitrogen atmosphere to form a second semiconductor layer formed of SiON between the substrate and the first semiconductor layer, dangling bond present in an interface between the first semiconductor layer and the substrate and carbon (C) or a carbon compound extracted from the interface may be reduced to lower an interface state density.

Thus, since the semiconductor device according to the exemplary embodiments of the present disclosure has low interface state density, high carrier mobility may be obtained, reducing ON resistance.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a semiconductor device, the method comprising:
    preparing a substrate formed of SiC;
    depositing crystalline or amorphous silicon (Si) on one surface of the substrate to form a first semiconductor layer; and
    performing a heat treatment under a nitrogen atmosphere to form a second semiconductor layer formed of SiCN between the substrate and the first semiconductor layer.

2. The method of claim 1, further comprising forming a third semiconductor layer on the first semiconductor layer using a Si compound.

3. The method of claim 2, further comprising performing a heat treatment under a nitrogen atmosphere to form a fourth semiconductor layer between the third semiconductor layer and the first semiconductor layer, after the forming of the third semiconductor layer.

4. The method of claim 2, wherein the third semiconductor layer is formed by oxidizing, nitriding, or oxy-nitriding an upper portion of the first semiconductor layer.

5. The method of claim 1, wherein the forming of the second semiconductor layer is undertaken at a temperature lower than an oxidation temperature of the first semiconductor layer.

6. A semiconductor device, comprising:
    a substrate formed of SiC;
    a first semiconductor layer disposed on the substrate and formed of silicon (Si); and
    a second semiconductor layer disposed to form an interface between the first semiconductor layer and the substrate by combining with atoms in the first semiconductor layer and the substrate, and formed of SiCN.

7. The semiconductor device of claim 6, further comprising a third semiconductor layer disposed on the first semiconductor layer and formed of a Si compound.

8. The semiconductor device of claim 7, further comprising a fourth semiconductor layer disposed between the third semiconductor layer and the first semiconductor layer and formed of SiON.

9. The semiconductor device of claim 7, wherein the Si compound is at least one selected from the group consisting of $SiO_2$, ($0<x<1$), and SiON.

10. The semiconductor device of claim 7, wherein the first semiconductor layer includes amorphous or crystalline Si.

11. A power semiconductor device, comprising:
    a first conductivity-type substrate fainted of SiC;
    a first conductivity-type drift region disposed on the substrate and formed of SiC;
    a second conductivity-type body region disposed on the drift region and formed of SiC;
    a first conductivity-type source region disposed in an upper portion of the body region;
    a first conductivity-type drain region disposed in an upper portion of the body region;
    a first gate layer disposed on an upper surface of the body region, covering portions of the source region and the drain region, and formed of SiCN;
    a second gate layer disposed on the first gate layer and formed of amorphous silicon;
    a third gate layer disposed on the second gate layer and formed of SiCN;
    a fourth gate layer disposed on the third gate layer and formed of a silicon compound; and
    a gate electrode disposed on the fourth gate layer.

12. A semiconductor device, comprising:
    a substrate formed of SiC;
    a first semiconductor layer disposed on the substrate and formed of silicon (Si);
    a second semiconductor layer disposed between the first semiconductor layer and the substrate and formed of SiCN;
    a third semiconductor layer disposed on the first semiconductor layer and formed of a Si compound; and
    a fourth semiconductor layer disposed between the third semiconductor layer and the first semiconductor layer and formed of SiON.

* * * * *